US006707492B1

(12) United States Patent
Itani (10) Patent No.: US 6,707,492 B1
(45) Date of Patent: Mar. 16, 2004

(54) SUCCESSIVE APPROXIMATION CALIBRATION APPARATUS, SYSTEM, AND METHOD FOR DYNAMIC RANGE EXTENDER

(75) Inventor: Nadi R. Itani, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/282,523

(22) Filed: Mar. 31, 1999

(51) Int. Cl.[7] ............................................. H04N 5/235
(52) U.S. Cl. ................... 348/229.1; 348/222.1; 341/139; 341/155
(58) Field of Search .......................... 348/222.1, 229.1; 341/126, 133, 134, 139, 155

(56) References Cited

U.S. PATENT DOCUMENTS 6,252,536 B1 * 6/2001 Johnson et al. ............. 341/155
6,323,900 B1 * 11/2001 Kobayashi .................. 348/241

* cited by examiner

*Primary Examiner*—Wendy R. Garber
*Assistant Examiner*—Jacqueline Wilson
(74) *Attorney, Agent, or Firm*—Steven Lin, Esq.

(57) ABSTRACT

A gain characteristic correctable dynamic range enhancement system (DRES) receives input signals from an imager device connected to a correlated double sampling (CDS) circuit for receiving the video signal from the CCD imaging device. The dynamic range enhancement system includes a variable gain amplifier (VGA), and a limited bit-width analog-to-digital converter (ADC) which digitizes the analog signal received from the VGA. The output of the ADC is provided to an initial bit range position of a wider bit-width shifter connected to the output of the ADC. The DRES system correctably extends the dynamic range of the imager device, subject to offsets providing linearity corrections at predetermined trip points, subject to determined offset values, to ensure that there are no discontinuities in the system transfer function.

8 Claims, 9 Drawing Sheets

CALIBRATION REFERENCE SELECT

SUCCESSIVE APPROXIMATION CALIBRATION APPARATUS, SYSTEM, AND METHOD FOR DYNAMIC RANGE EXTENDER

CROSS REFERENCE TO RELATED APPLICATIONS

This application is related to patent application Ser. Nos. 09/283,779, 09/283,098, 09/282,524, 09/282,515, and 09/283,112, respectively entitled "Dynamic Range Extender Apparatus, System, and Method for Digital Receiver System" having inventors Sandra Marie Johnson and Nadi Rafik Itani and issued as U.S. Pat. No. 6,252,536 on Jun. 26, 2001 (Cirrus Logic Docket No. 0930-CIC); "Phase Locked Loop Circuits, Systems, and Methods" having inventors Douglas R. Holberg and Sandra Marie Johnson (Cirrus Logic Docket No. 0893-CIC); "Preview Mode Low Resolution Output System and Method" having inventors Douglas R. Holberg, Sandra Marie Johnson, and Nadi Rafik Itani (Cirrus Logic Docket No. 0944-CIC); "Amplifier System with Reducable Power" having as inventor, Nadi Rafik Itani (Cirrus Logic Docket No. 0965-CA); "CCD Imager Analog Processor Systems and Methods" having inventors Douglas R. Holberg, Sandra Marie Johnson, Nadi Rafik Itani, and Argos R. Cue (Cirrus Logic Docket No. 0929-CIC). Each of the above applications is filed on even date herewith. Additionally, this application is related to patent application Ser. No. 08/856,468, entitled "System and Method for Enhancing Dynamic Range in Images" invented by S. Khalid Azim and issued as U.S. Pat. No. 6,137,533 on Oct. 24, 2000 (Cirrus Logic No. 0720-CIC). Each of these applications is incorporated herein by reference in its entirety.

BACKGROUND OF THE INVENTION

1. Field of the Invention

This invention relates to analog-to-digital converter circuitry and more particularly to successive approximation calibration apparatus, systems, and methods for dynamic range extension in analog-to-digital converter circuitry for camera and imaging systems.

2. Description of Related Art

In recent years, solutions to difficult mixed signal problems related to dynamic range control in camera and imager devices and systems have been attempted. Particularly, it has been desired to develop low cost and low power approaches to improving the dynamic range of digital images. Further, new solutions to image data acquisition and processing have been attempted to result in visible improvements in image quality. Digital camera image quality improvement are sought for video as well as still image camera systems and imaging systems which use charge-coupled device (CCD) imagers, CMOS imagers, and other kinds of imagers.

It is known that the number of bits required for analog-to-digital conversion of CCD data depends upon the noise floor of a CCD, based upon photon shot noise, dark-current noise, and thermal noise from a CCD output amplifier. A system to capture the CCD output requires a quantization noise level lower than the noise floor. The maximum output of the CCD and the noise floor of the CCD can be used to determine the maximum number of bits required for an analog-to-digital converter to have its quantization noise level below the noise level of the CCD. For a particular CCD, the noise voltage level is estimated at about 150 $\mu$Vrms. The maximum CCD output voltage is about 800 mV. Based upon these conditions, a 12-bit analog-to-digital converter is useful based upon dynamic range requirements. Unfortunately, a 12-bit converter is costly in terms of power and area.

It is further desirable to achieve enhanced image quality with images having improved detail in both dark and light image regions, while avoiding the penalties of high power consumption and large silicon area usage.

U.S. Pat. No. 4,647,975, entitled "Exposure Control System for an Electronic Imaging Camera Having Increased Dynamic Range" describes an electronic imaging system with an expanded dynamic exposure range implemented in two exposure intervals.

It is additionally desirable to maintain output linearity and monotonicity during dynamic range extension for analog-to-digital converter circuitry, so that continuity is maintained between segments of the operational characteristic of the converter circuitry irrespective of proximity to trip points.

SUMMARY OF THE INVENTION

According to the present invention, a dynamic range expandable imaging system which has a correlated double sampling system, a variable gain amplifier circuit connected to said correlated double sampling system, an analog-to-digital converter connected to said variable gain amplifier circuit, and a shifter containing a predetermined number of bits greater than the digital output width of said analog-to-digital converter is calibrated according to a successive approximation technique to ensure output linearity and monotonicity during dynamic range extension for analog-to-digital converter circuitry, so that continuity is maintained between segments of the operational characteristic of the converter circuitry irrespective of proximity to trip points. A shifter is connected to said analog-to-digital converter for receiving the output bit set of the analog-to-digital converter into predetermined locations in the shifter. Input test signals are injected from a predetermined input circuit for sampling by a correlated double sampling system, above and below a first trip point in VGA input values at which VGA gain shifts have been determined, and the difference in analog-to-digital converter output corresponding to said first trip point is determined. Further, input test signals from a predetermined input circuit are provided for sampling by a correlated double sampling system, above and below a next trip point in VGA input values at which VGA gain shifts have been determined and the difference in analog-to-digital converter output corresponding to said next trip point is determined as a calibration value. According to the present invention, a dynamic range enhancement system (DRES) is provided for an imager device which includes a correlated double sampling (CDS) circuit for receiving the video signal from the CCD imaging device, a variable gain amplifier (VGA) subject to automatic gain control, an analog-to-digital converter (ADC) which digitizes the analog signal received from the VGA, an offset mechanism which adjusts the digital output of the ADC to ensure trip-point monotonicity and linearity, and a shifter for adjusting the bit-width of the digital signal to compensate for a change in the amplification provided by the variable gain amplifier. According to the present invention, dynamic range enhancement is achieved in a signal processing system for an imager device subject to offset correction at predetermined trip-points in the ADC characteristic.

DETAILED DESCRIPTION OF THE PREFERRED EMBODIMENTS

Figure 1:
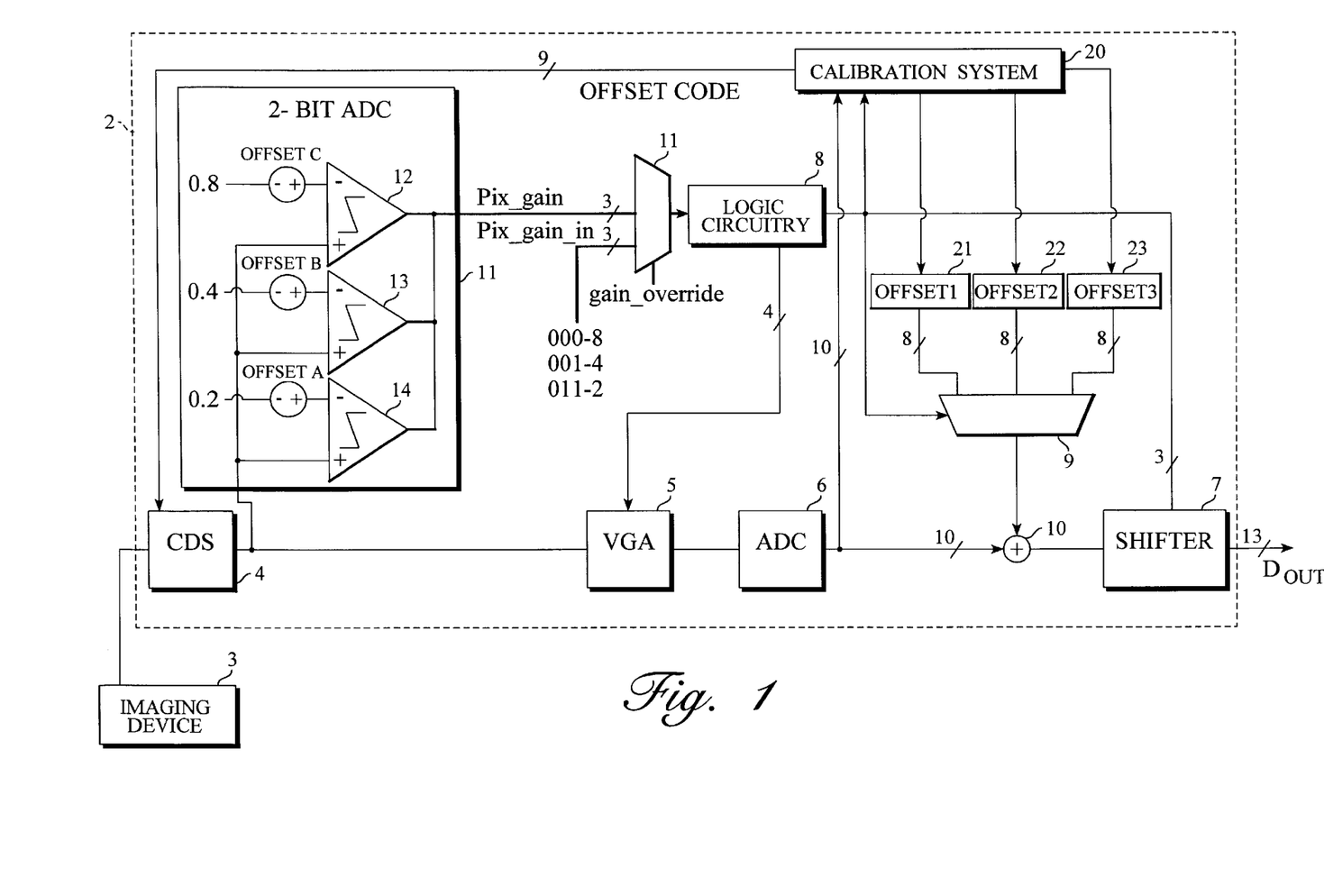
FIG. 1 is a block diagram of a controllable dynamic range extension signal processing circuit including a correlated double sampling (CDS) circuit for receiving the video signal from the CCD imaging device, a variable gain amplifier (VGA)subject to automatic gain control, and an analog-to-digital converter (ADC) which digitizes the analog signal received from the VGA, according to the present invention.

Referring now to FIG. 1, there is shown a block diagram of a controllable dynamic range extension signal processing (DRX) circuit 2 for processing signals received from a selected imaging device 3. The DRX circuit 2 includes a correlated double sampling (CDS) circuit 4 which receives the video signals from the imaging device 3 which may be a charge coupled device (CCD), for example. The DRX circuit 2 further includes a variable gain amplifier (VGA) 5 subject to automatic gain control according to the present invention, as will be discussed in detail below. The VGA 5 has input and output connections which respectively receive an input analog signal and produce an output amplified analog signal in accordance with the gain setting which is current for the VGA 5. The DRX circuit 2 further includes an analog-to-digital converter (ADC) 6 which digitizes the analog signal received from the VGA 5. According to one embodiment of the present invention, the ADC produces a 10-bit digital output representative of the analog signal received from the VGA 5. The DRX circuit 2 further includes a shifter 7 for controllably 1shifting the digital bits in a group to increase or decrease the magnitude of the digital output. Such an increase or decrease is accomplished according to one embodiment of the present invention by applying successive factors of two (2) or one-half (½), for example. The DRX circuit 2 further includes logic circuitry 8 for processing a received PIX_GAIN value to produce a control signal governing whether to shift the bit contents of shifter 7 and, if so, in what direction and to what extent. The DRX circuit 2 further includes a multiplexer 9 for applying a selected, predetermined offset value, e.g., OFFSET1, OFFSET2, or OFFSET3, under direction of an output signal from logic circuitry 8. These offset values are generated with calibration system 20 as will be discussed in greater detail below, and they are stored according to one embodiment in respective offset registers 21–23. The DRX circuit 2 further includes a summer 10 connected to multiplexer 9 and to ADC 6. The summer 10 receives a selected digital offset value from multiplexer 9 as directed by logic circuitry 8 for summation with the digital output received from ADC 6. The DRX circuit 2 further includes a 2-bit analog-to-digital converter 11 according to one embodiment of the present invention, to establish a PIX_GAIN value. The PIX_GAIN value is an input to logic circuitry 8, and the output of logic circuitry 8 is provided to VGA 5 as a control signal to determine the gain setting of VGA 5. As noted above, an offset value is provided to summer 10 from multiplexer 9. Further, the shift status and the amount to be exercised by shifter 7 is determined for producing an extended dynamic range output signal DOUT, for example to a precision level of 13 bits for example. The 2-bit ADC 11 within DRX circuit 2 in turn includes first, second, and third comparators, respectively 14–12, set to successively increasing doubled thresholds for example, for effecting dynamic range extension, according to one embodiment of the present invention. CDS 4 receives a signal from an imaging device 3 which may be a charge coupled device (CCD). The CDS 4 is connected at its output to VGA 5 and 2-bit ADC 11. The output of 2-bit ADC 11 is connected through logic circuitry 8 to VGA 5 to control the level of VGA amplification, and to logic circuitry 8 to provide it with a pixel gain value, PIX_GAIN, for selection of an offset value with multiplexer 9. The output of VGA 5 is connected to the input of ADC 6, and the outputs of ADC 6 and multiplexer 9 are connected to input sides of adder 10. The output of adder 10 is connected to shifter 7 to enable shifting operation in accordance with the output of logic circuitry 8. The output of shifter 7 is DOUT. The DRX circuit 2 further includes a calibration system 20 and first through third offset registers respectively 21–23, according to one embodiment of the present invention. The details of calibration system 20 and its operation are described below in connection with FIGS. 8A–8C.

Figure 2:
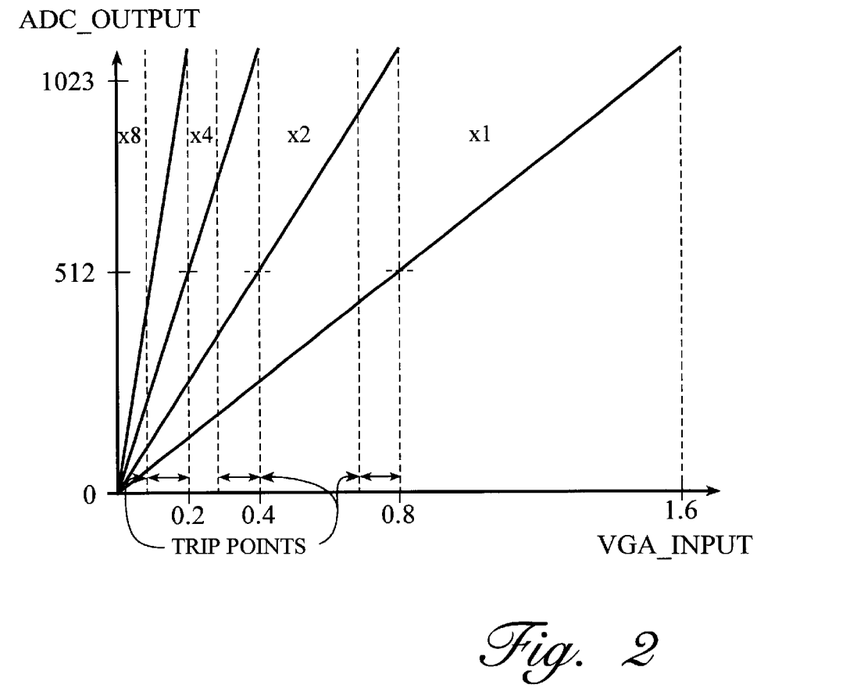
FIG. 2 is a graph of a variable gain control function subject to dynamic range extension according to one embodiment of the present invention.
Figure 4:
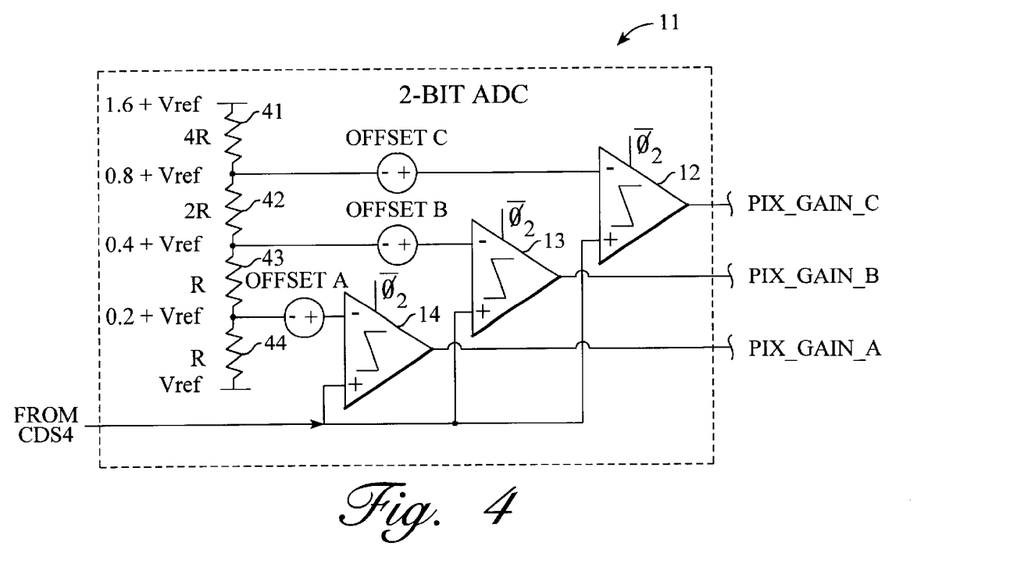
FIG. 4 is a circuit diagram of a 2-bit analog-to-digital converter system including first, second, and third comparators set to successively increasing thresholds, for effecting dynamic range extension, according to one embodiment of the present invention.

Referring now to FIG. 2, there is shown a graph of the output of ADC 6 for selected gain settings of x1–x8, according to one embodiment of the present invention. The ADC_OUTPUT, i.e., the output of the analog-to-digital converter 6, can range from zero to full-scale (i.e., from zero to 1023) while VGA_INPUT values range from zero to about 0.2 at a gain setting of x8. Alternatively, the output of the analog-to-digital converter 6, can range from zero to full-scale (i.e., from zero to 1023) when the VGA_INPUT values range from about zero to about 0.4 at a final gain setting of x4. In another case, the output of the analog-to-digital converter 6, can range from zero to full-scale (i.e., from zero to 1023), while the VGA_INPUT ranges from zero to about 0.8 at a final gain setting of x2. In even another case, the output of the analog-to-digital converter 6, can range from zero to full-scale (i.e., from zero to 1023), while the VGA_INPUT ranges from about zero to about 1.6 at a final gain setting of the VGA 5 of x1. In operation according to the present invention, the highest possible gain setting is selected for a particular VGA input signal range. When a trip point is reached at which the VGA input corresponds to an out-of-range ADC output value, e.g., greater than 1023, the VGA gain is reduced to a next lower level, which is one half of the immediately prior gain. The trip points lie at regular intervals spaced from each other, for example at VGA input values which are double the value of the next lower value trip point. As the VGA input increases in value beyond a particular trip point, the gain of the VGA 5 is cut in half, resulting in an approximately halved ADC 6 output level. For example, when the ADC output reaches approximately 1023 according to one embodiment, the output level of the ADC 6 abruptly drops to one half of 1023, i.e., approximately to 512, as the gain of the VGA 5 is suddenly cut in half. The trip points illustrated graphically in FIG. 2 are implemented according to one embodiment of the present invention with the comparators 12–14 in 2-bit ADC 11. As shown in FIG. 1, the indicated comparators 14–12 are provided with successively doubled threshold values which correspond to the respective trip points expressed in FIG. 2. The analog output voltage level from CDS 4 is such that it exceeds particular ones of the negative input settings provided to the respective comparators 12–14. Consequently, a selected different output signal from the particular associated comparator is provided to VGA 5 and to logic circuitry 8, to indicate the fact of exceeding. The comparators are intentionally biased slightly below the ideal trip point. In this way, the gain is guaranteed to switch before the ADC reaches the full scale level of 1023. This intentional offset is needed, since non-idealities in the analog circuitry can produce offsets which could cause the ADC to saturate at 1023 for a portion of the transfer function before the gain is changed in the VGA, thus producing some flat regions in the transfer function. The trip point uncertainty is shown as a dotted region in FIG. 2 and the intentional offset biasing is shown in FIG. 4 as offset A, B, C. The logic circuitry 8 provides a compensatory signal to shifter 7 to cause a doubling shift in the shifter 7 whenever a trip point is reached which halves the VGA and corresponding ADC output levels. According to one embodiment of the present invention, the ADC output is adjusted at summer 10 to ensure continuity in the shifter output as trip points are crossed with the resulting adjustment of VGA gain levels and shifter bit settings. These adjustments are to correct for the potential offset error caused by the fact that the analog gain changes in the VGA can not match the gain changes or shifts in the shifter section. Thus, these offset adjustments are needed when switching between various VGA settings.

Figure 3:
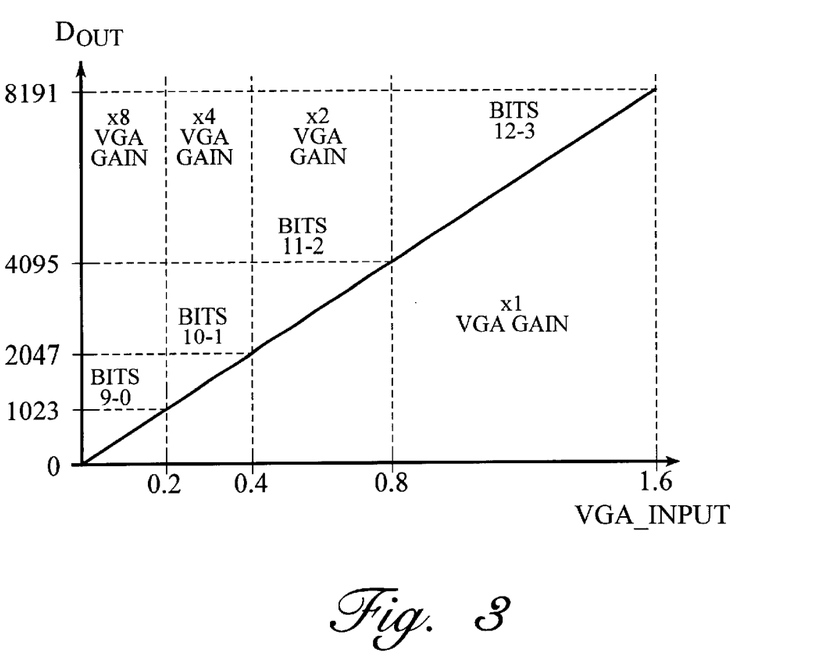
FIG. 3 is a graph of DOUT as a function of VGA input, according to one embodiment of the present invention.

Referring now to FIG. 3, there is shown a graph of the output of shifter 7 (DOUT) as a function of VGA input, with DOUT ranging from zero to 8191, according to one embodiment of the present invention. To express the DOUT range corresponding to a VGA_INPUT range from zero to about 0.2, output bits 9–0 are employed. To express the DOUT range corresponding to a VGA_INPUT range from 0.2 to about 0.4, output bits 10–1 are employed. To express the DOUT range corresponding to a VGA_INPUT range from 0.4 to about 0.8, output bits 11–2 are employed. To express the DOUT range corresponding to a VGA_INPUT range from 0.8 to about 1.6, output bits 12–3 are employed. As can be seen, the curve of DOUT is smooth, monotonic, and continuous, even at transitions associated with trip points 0.2, 0.4, and 0.8. The point 1.6 marks the end-of-range for VGA input values, and does not represent a trip point according to this embodiment of the present invention. According to another embodiment of the present invention, in which a 3-bit ADC or an n-bit ADC is used in lieu of 2-bit ADC 11, additional thresholds are established within the scope and meaning of the present invention. Such thresholds amount to additional trip points, and require additional comparators connected in series to supplement the configuration of the ADC 6 embodiment expressed in FIG. 1.

Referring now to FIG. 4, there is shown a circuit diagram of a 2-bit analog-to-digital converter (ADC) system 11 according to the present invention. The ADC system 11 includes first, second, and third comparators, respectively 12, 13, and 14. These comparators 14–12 are set to successively increasing thresholds, for detecting the need for dynamic range extension and for producing signals used to set the level of amplification applied by VGA 5, according to one embodiment of the present invention. Each of comparators 12–14 has a positive and a negative input. According to the indicated embodiment, the positive inputs of respective comparators 12–14 are connected to the output of CDS 4. The 2-bit analog-to-digital converter system 11 further includes series connected resistors respectively 41–44, having respective connection nodes there between. In particular, resistor 44 is connected to resistor 43 at a first connection node on one side of resistor 44, as well as to a selected reference voltage, Vref, at the remaining side of resistor 44. Resistor 43 is connected to resistor 42 at a second connecting node, and resistor 42 is connected to resistor 41 at a third connecting node. The respective first, second, and third connecting nodes provide voltage settings for respective comparators 14–12, at which the comparators express trip points at which VGA gain levels are switched and shifter action is required to compensate for the VGA gain level switching that has been accomplished. According to one embodiment of the present invention, each of resistors 43–44 is fabricated to be substantially equal to the other one of the resistors 43, 44. The resistance of resistor 42 is further twice the resistance of resistor 43, and the resistance of resistor 41 is twice the resistance of resistor 42, according to one embodiment of the present invention. Resistors 41–44 are thus configured as a voltage divider circuit. Resistor 41 is connected to a voltage level of 1.6 volts plus Vref, according to one embodiment of the present invention, causing the voltage level at the node between resistors 41 and 42 to be 0.8 volts plus Vref, subject to an intentional voltage offset OFFSET C away from the predetermined design value. Further, the voltage level between resistors 42 and 43 is 0.4 volts plus Vref subject to an intentional voltage offset OFFSET B. Further, the voltage level between resistors 43 and 44 is 0.2 volts plus Vref subject to an intentional voltage offset OFFSET A away from the predetermined design value. These intentional offsets bias the comparators slightly below the ideal trip point in order to prevent the 10-bit ADC from becoming saturated before the trip point is reached, and to prevent a flat region in the transfer function.

Figure 5:
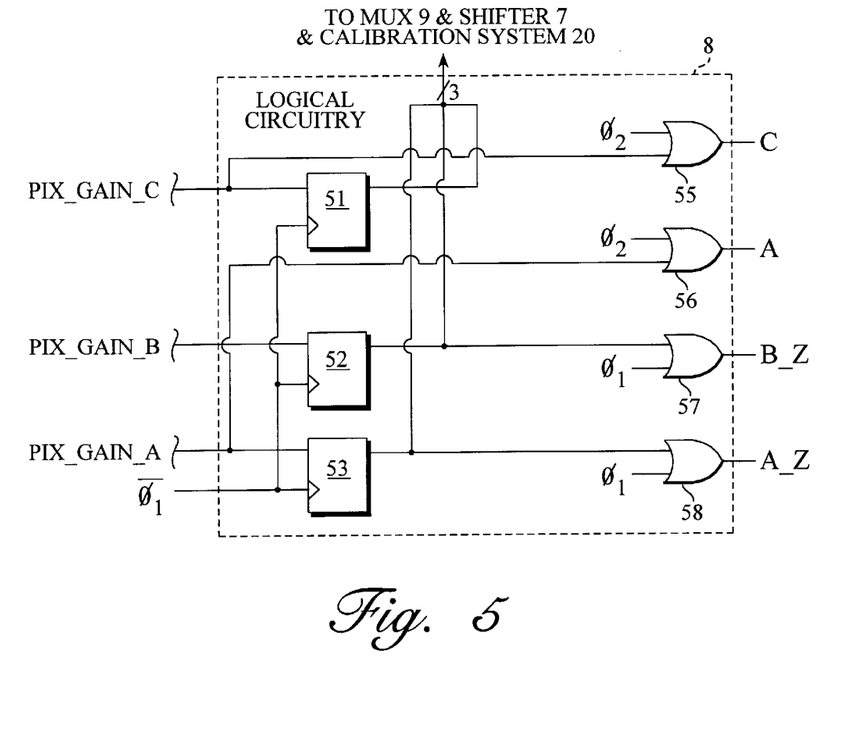
FIG. 5 is a block diagram of a logic circuit according to one embodiment of the present invention, for generating values of A, C, B_Z, and A_Z, for connecting switch settings of a variable gain amplifier (VGA) as shown in FIG. 7.
Figure 7:
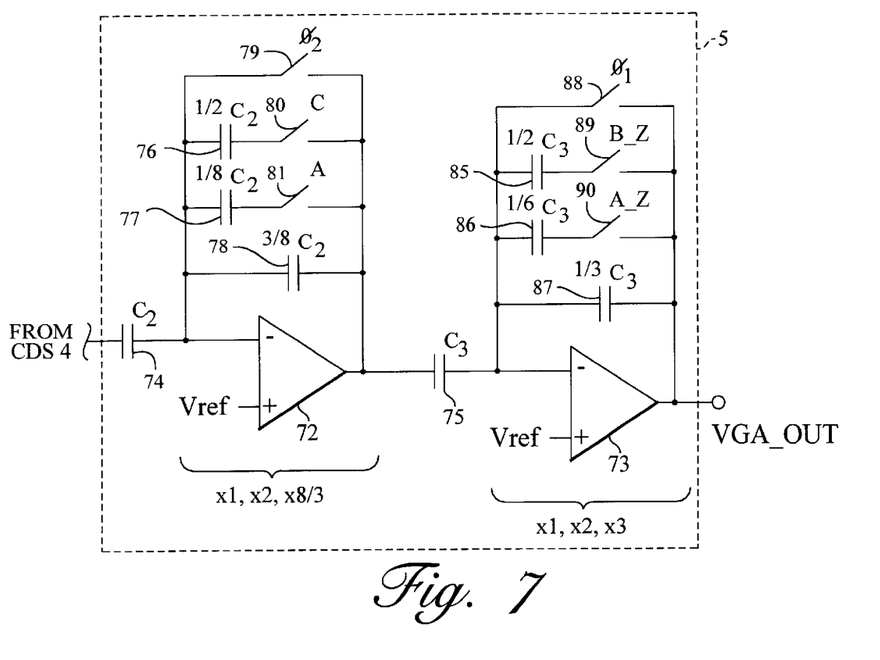
FIG. 7 is a block diagram of a variable gain amplifier (VGA) subject to automatic gain control, according to the present invention.

Referring now to FIG. 5, there is shown a block diagram of a logic circuit 8 according to one embodiment of the present invention, for generating the signals A, C, B_Z, and A_Z, for connecting switch settings of a variable gain amplifier (VGA) 5 as shown in FIG. 7. Logic circuit 8 particularly includes first, second, and third flip-flops respectively 51, 52, and 53; and first, second, third, and fourth OR gates 55, 56, 57, and 58. The output pixel gain values from respective comparators 12–14 of 2-bit ADC 11 are provided as respective pixel gain setting values PIX-GAIN_C, PIX-GAIN_B, and PIX-GAIN_A to corresponding flip-flops 51–53. When flip-flops 51–53 are clocked by a clock signal from clock source ϕ1(bar), the respective flip-flop output values are provided to multiplexer 9 and shifter 7 and calibration system 20. The outputs of flip-flops 52 and 53 are additionally provided to respective OR gates 57 and 58 to produce respective logical outputs B_Z and A_Z, which are provided as control outputs in conjunction with the outputs of OR gates 55 and 56 to VGA 5. The outputs of OR gates 55 and 56 are provided with clock ϕ2 pulses.

Figure 6:
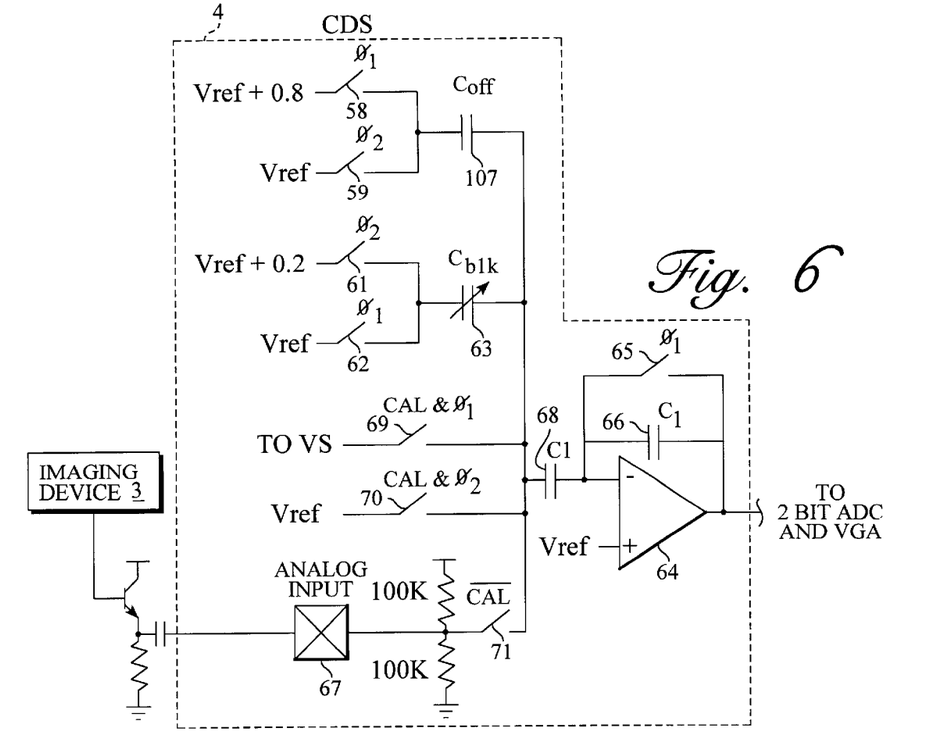
FIG. 6 is a block diagram of a correlated double sampling (CDS) circuit for receiving the video signal from the CCD imaging device, according to the present invention.

Referring now to FIG. 6, there is shown a block diagram of a correlated double sampling (CDS) circuit 4 for receiving a signal from an imaging device 3 such as a charge coupled device (CCD), as used in connection with one embodiment of the present invention including features and elements permitting calibration of offset registers 21–23 as discussed herein. CDS 4 particularly includes first and second switches 58 and 59 respectively, which are opened and closed according to separate clock phases, $\phi_1$ and $\phi_2$, for applying respective voltage levels Vref+0.8 and Vref at the respective indicated clock times to conduct respective switching operations with first and second switches 58 and 59. Switches 58 and 59 are connected to an offset capacitor 107 (Coff), permitting alternate application of Vref+0.8 and Vref voltage levels to Coff with respective clock signals $\phi_1$ and $\phi_2$, CDS 4 further includes third and fourth switches 61 and 62 respectively, which are opened and closed according to respective clock signals $\phi_2$ and $\phi_1$, for applying respective voltage levels Vref+0.2 and Vref at the respective indicated clock times to conduct respective switching operations with third and fourth switches 61 and 62. CDS circuit 4 additionally includes a variable black level setting capacitor 63, and an op-amp 64 which has a negative and a positive input node. The positive input node of op-amp 64 is set to Vref. The negative input node of op-amp 64 is a common node for various components of CDS circuit 4. CDS circuit 4 additionally includes a switch 65 which opens and closes according to clock phase $\phi_1$ and is connected from the negative input node of op-amp 64 to its output connection. CDS circuit 4 additionally includes a capacitor $C_1$, i.e., capacitor 66, which is connected from the negative input node of op-amp 64 to its output connection. CDS circuit 4 additionally includes an analog input pad 67 which is connected to imaging device 3 for receiving input analog signals of selected kinds, such as for example input video signals. CDS circuit 4 additionally includes a capacitor Cl, i.e., capacitor 68, which is connectable in series with analog input pad 67 and is connectable to the negative input node of comparator 64. CDS circuit 4 further includes first through third calibration switches 69–71, which respectively connect capacitor 68 to VS, Vref, and to analog input pad 67 at respective signal pulse times CAL & ϕ1, CAL & ϕ2, and $\overline{\text{CAL}}$. CDS circuit 4 enables calibration of DRX circuit 2 according to the present invention. CDS circuit 4 further assists in establishing the amounts of offset values provided to multiplexer 9 for selective application to summation node 10. This ensures continuity and monotonicity over trip points at which coordinated gain settings and bit shifts are undertaken. It further results in an extended dynamic range from an abbreviated bit length ADC 6. An example of the construction of calibration input circuit 60 according to an embodiment of the present invention is set forth in FIG. 8A.

Referring now to FIG. 7, there is shown a variable gain amplifier (VGA) 5 subject to automatic gain control in accordance with feedback from the output of 2-bit ADC 11 by controlling the opening and closing of particular switches, according to the present invention. In particular, VGA 5 includes first and second op-amps 72 and 73 respectively. VGA 5 further includes first and second capacitors 74 and 75, i.e., capacitors $C_2$ and $C_3$. The first capacitor 74 is connected to CDS 4 (see FIG. 1) and to the negative input connection of op-amp 72. The positive connection of op-amp 72 is connected to Vref, as is the positive input connection of op-amp 73. The second capacitor 75 is connected to the output connection of op-amp 72 and the negative input connection of op-amp 73. Op-amp 72 is adjustable to gain settings of x1, x2, and x(2 and 2/3). Op-amp 73 is settable to gain settings of x1, x2, and x3. VGA 5 further includes capacitors 76, 77, and 78; switches 79–81; capacitors 85–87; and switches 88–90. Capacitor 76 and switch 80 are connected in series. Capacitor 77 is connected in series with switch 81. Switch 79, the series combination of capacitor 76 and switch 80, the series combination of capacitor 77 and switch 81, and capacitor 78 are connected in parallel between the negative input node of op-amp 72 and its output node. Switch 79 opens and closes as a function of clock phase $\phi_2$. Switch 80 opens and closes with the logical value of logical signal C at the output of logic circuitry 8. Switch 81 opens and closes with the logical value of logical signal A at the output of logic circuitry 8. The value of capacitor 76 according to one embodiment of the present invention is ½ of the capacitance of capacitor 74. The value of capacitor 77 according to one embodiment of the present invention is ⅛ of the capacitance of capacitor 74. The value of capacitor 78 according to one embodiment of the present invention is ⅜ of the capacitance of capacitor 74. Capacitor 85 and switch 89 are connected in series. Capacitor 86 is connected in series with switch 90. Switch 88, the series combination of capacitor 85 and switch 89, the series combination of capacitor 86 and switch 90, and capacitor 87 are connected in parallel between the negative input node of op-amp 73 and its output node. Switch 88 opens and closes as a function of clock phase $\phi_1$. Switch 89 opens and closes with the logical value of logical signal B_Z at the output of logic circuitry 8. Switch 90 opens and closes with the logical value of logical signal A_Z at the output of logic circuitry 8. The value of capacitor 85 according to one embodiment of the present invention is ½ of the capacitance of capacitor 75. The value of capacitor 77 according to one embodiment of the present invention is ⅙ of the capacitance of capacitor 75. The value of capacitor 87 according to one embodiment of the present invention is ⅓ of the capacitance of capacitor 75.

Figure 8A:
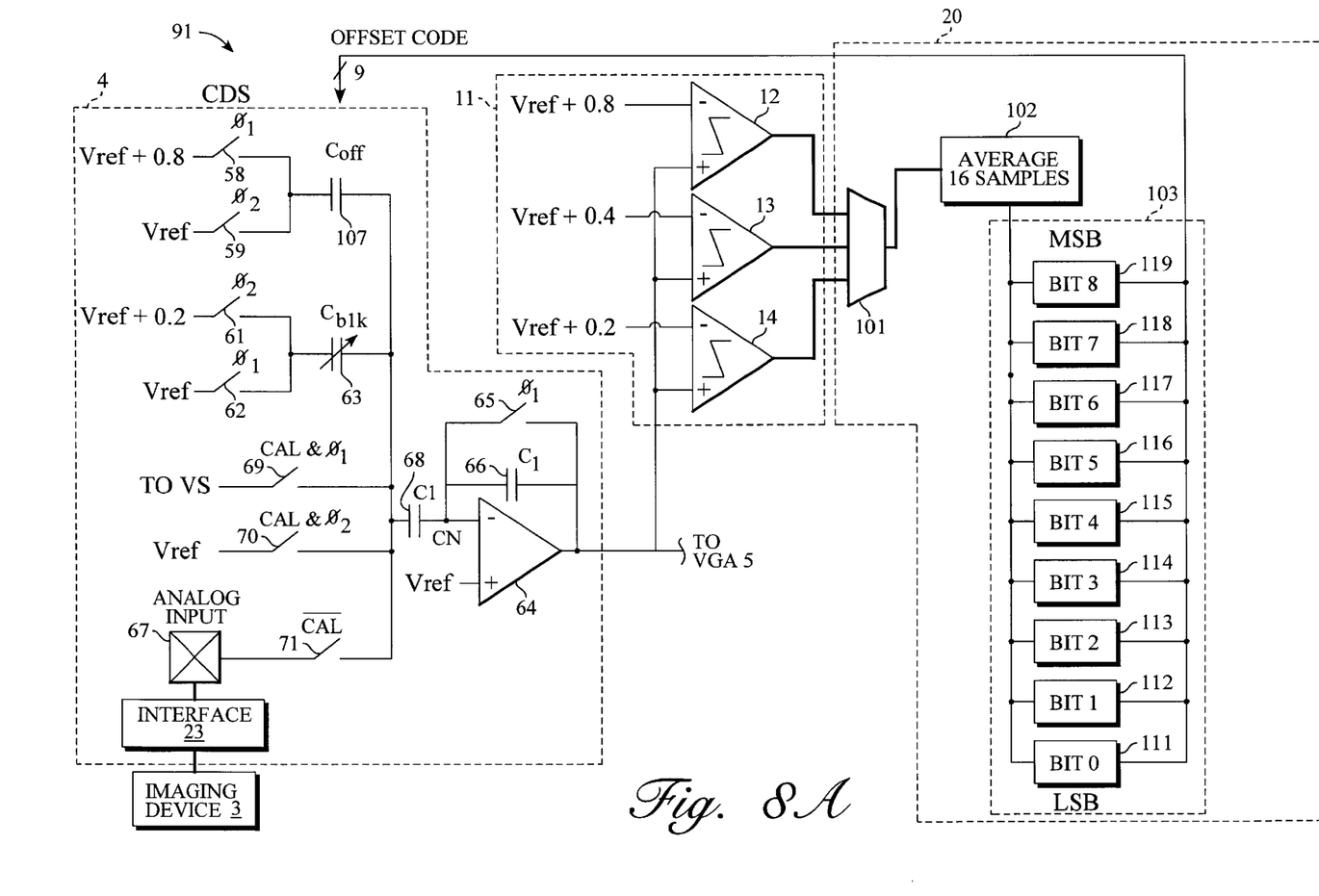
FIG. 8A is a block diagram of a circuit system in a controllable dynamic range extension signal processing (DRX) circuit including a correlated double sampling (CDS) circuit for receiving the video signal from the CCD imaging device, including a calibration register, in accordance with an embodiment of the present invention.

Referring now to FIG. 8A, there is shown a block diagram of circuit system 91 for a portion of a controllable dynamic range extension signal processing (DRX) circuit, which includes a correlated double sampling (CDS) circuit 4 for receiving the video signal from the CCD imaging device 3 for transmittal to a variable gain amplifier (VGA) (not shown) and an analog-to-digital converter (ADC) (not shown) for digitizing the analog signal received from the VGA. The circuit system 91 further includes a 2-bit ADC 11, and calibration system 20, in accordance an embodiment of the present invention. The 2-bit ADC 11 includes first, second, and third op-amps, respectively 14–12, set to successively increasing thresholds, for effecting dynamic range extension, according to one embodiment of the present invention. CDS 4 includes first and second switches 61 and 62 respectively, which are opened and closed according to separate clock phases, $\phi_1$ and $\phi_2$, for applying respective voltage levels $V_{ref}$ and $V_{ref}+0.2$ at the respective indicated clock times. CDS circuit 4 additionally includes a variable black level setting capacitor 63, and an op-amp 64 which has a negative and a positive input node. The positive input node of op-amp 64 is a common node for various components of CDS circuit 4. CDS circuit 4 additionally includes a switch 65 which opens and closes according to clock phase $\phi_1$ and is connected between the negative input node and the output node of op-amp 64. CDS circuit 4 additionally includes a capacitor Cl, i.e., capacitor 66, which is connected between the negative input node and the output node of op-amp 64. CDS circuit 4 additionally includes an analog input pad 67 which is connected to imaging device 3 through an emitter-follower and AC coupling capacitor for receiving input analog signals of selected kinds, such as for example input video signals. CDS circuit 4 additionally includes a capacitor $C_1$, i.e., capacitor 68, which is connected in series with switch 71 and is connected to a common node at the negative input node of op-amp 64. CDS circuit 4 is connected at the common node to calibration circuitry for calibrating the DRX circuit 2 according to the present invention. This is done to establish the values of offset values provided to multiplexer 9 for selective application to summation node 10. As a result, it is ensured that continuity and monotonicity are established over selected trip points. At these trip points, coordinated gain settings and bit shifts are undertaken in order to obtain an extended dynamic range from an abbreviated bit length ADC 6. The circuit system further includes first, second, third and fourth switches 58–62; and an offset capacitor 107 connected to capacitor 68. Capacitor 63 is connected to third and fourth switches 61–62. First switch 58 connects capacitor 107 to $V_{ref}+0.8$ at $\phi_1$ phase determined times, and to $V_{ref}$ at $\phi_2$ phase determined times. Switches 69–70 are connected to capacitor 68. As noted above, CDS circuit 4 thus assists in establishing offset values for application to summation node 10 to ensure continuity and monotonicity over selected trip points. Calibration system 20 is connected to 2-bit ADC circuit 11 and to CDS 5 according to one embodiment of the present invention, with an offset code control line to variable capacitor 63. Calibration system 20 includes a multiplexer 101 connected to the output of 2-bit ADC 11 for receiving each of the three output lines of the comparators 12–14 of the ADC 11. Calibration system 20 further includes an averaging circuit 102 for averaging over a selected number, e.g., 16 samples. Calibration system 20 further includes a multiple bit register system 103 for storing bits from a most significant to least significant bit, to provide an offset code value to control the capacitance of variable capacitor 63. Bit register system 103 includes a plurality of bit circuits 111–119 connected in parallel and providing correction bits of ascending significance in a register system according to the present invention.

Figure 8B:
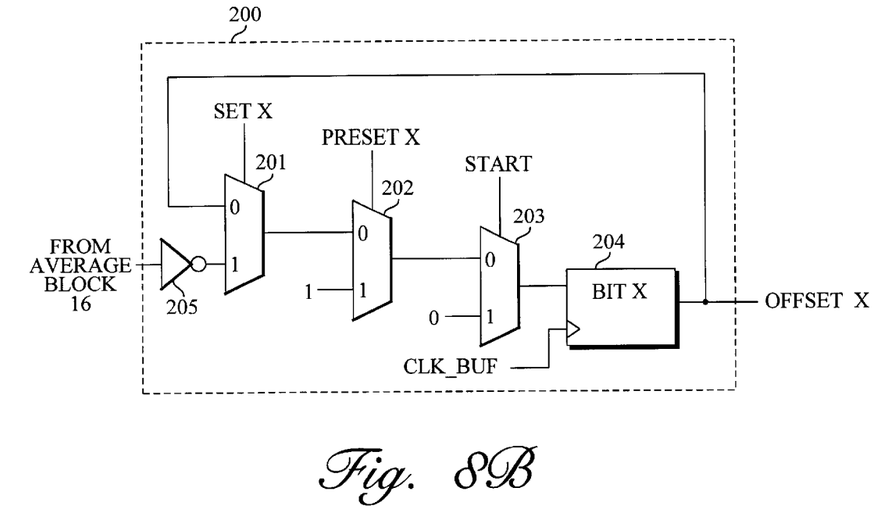
FIG. 8B is a block diagram of an offset storage bit register system for a controllable dynamic range extension signal processing circuit, in accordance with the present invention.

Referring now to FIG. 8B, there is shown a block diagram of an offset storage bit register 200 serving as an example of one of bit circuits 111–119, for a controllable dynamic range extension signal processing (DRX) circuit 2, in accordance with the present invention. The DRX circuit 2 includes first, second, and third series connected multiplexers respectively 201–203 and a flip-flop 204 connected to multiplexer 203 at the output thereof. The signal CAL controls the opening and closing of switches 69–71 (FIG. 6) during calibration operation. In particular, to calibrate the respective offset registers 21–23 (shown in FIG. 1) with corresponding offset values having according to a preferred embodiment nine bits, the value of each individual bit is determined separately, beginning with the most significant bit. To begin, a start signal activates multiplexer 203 to set flip-flop 204 to zero. Initially, the output of multiplexer 202 is a logical "one" value which is used to preset the value of the bit X flip-flop 204, which is the x-th component of register 103 as shown in FIG. 8A. The first, second, and third multiplexers 201–203 are series connected each to produce a single bit, and the last multiplexer 203 in the series is connected to flip-flop 204 for providing an output signal offset X. The offset signal is fed back to the black level capacitor 63 to control the offset added to the output of the CDS circuit 4 that is fed to the 2-bit ADC 11. Thus, to calibrate the respective offset registers 21–23, the value of each individual bit is determined separately, beginning with the most significant bit. The flip-flop 204 is set to zero, and then, the output of multiplexer 203 is allowed through to flip-flop 204. The output of multiplexer 202 is initially a logical "one" value. This value is used to preset the value of the bit x flip-flop 204, which is the x-th component of register 103. To determine a particular offset value, nine significant bits are tested to establish each offset value. For each significant bit, the output of multiplexer 101 is repeatedly observed, and the keep status of a test bit is established by averaging the results of the multiplexer observations. Accordingly, particular ones of register latch elements 111–119 are successively determined. The offset code is used to establish a particular setting of variable capacitor 63 (e.g., the black code capacitor). The variable capacitor 63 provides an offset value which is subject to a shift provided by offset capacitor 107, to determine whether the test value processed is to be kept or rejected. By successively checking from most to least significant test values, offset values are determined for each transition.

Figure 8C:
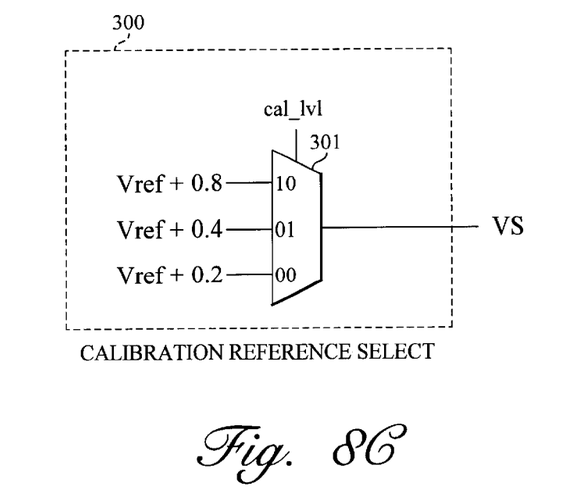
FIG. 8C is a block diagram of a calibration reference selection circuit for a controllable dynamic range extension signal processing circuit, in accordance with the present invention.

Referring now to FIG. 8C, there is shown a block diagram of a calibration reference selection circuit 300 for a controllable dynamic range extension signal processing (DRX) circuit 2, in accordance with the present invention. In particular, input circuit 300 includes a multiplexer 301. The multiplexer 301 is controlled by a calibration level signal cal_lvl which is used to apply a two-bit calibration level selection code to select one of input voltage levels, Vref+0.8, Vref+0.4, or Vref+0.2, for application at the output of multiplexer 301. The selected output value from multiplexer 301 is applied to provide an output signal VS for use in DRX circuit 2 according to one embodiment of the present invention. In FIG. 6, the signal VS is applied to capacitor 68 when calibration signal CAL & $\phi_1$ closes switch 69. Then, when the calibration signal CAL & $\phi_1$ has so applied VS, the reference voltage signal Vref is applied according to clock signal $\phi 2$. These calibration reference voltages are used in combination with an offset level to find the exact trip point levels of comparators 12–14.

Figure 8D:
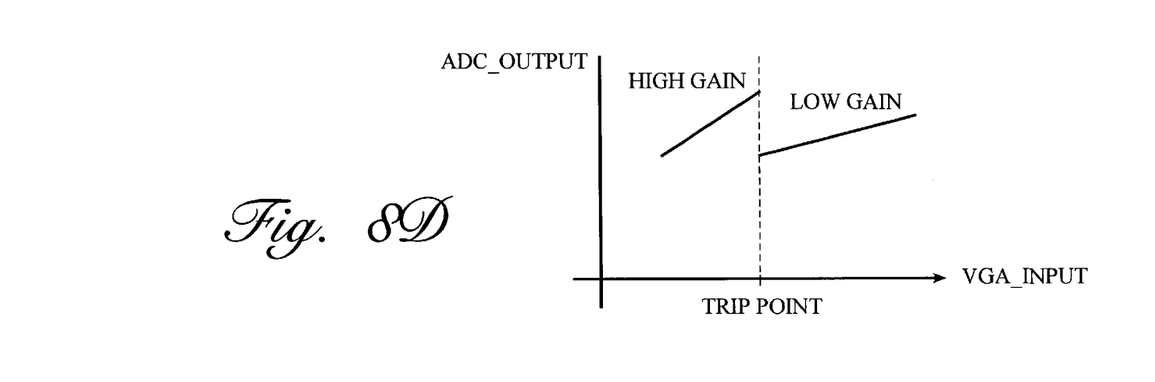
FIG. 8D is a graph of the output of an analog-to-digital converter for selected gain settings of high and low gain, according to one embodiment of the present invention.

Referring now to FIG. 8D, there is shown a graph of the output of ADC 6 for selected gain settings of high and low gain, according to one embodiment of the present invention. As is evident, during high gain operation, the level of the VGA input remains below an indicated trip point. After the level of VGA input increases beyond the trip point, operation continues in a low gain mode.

Figure 8E:
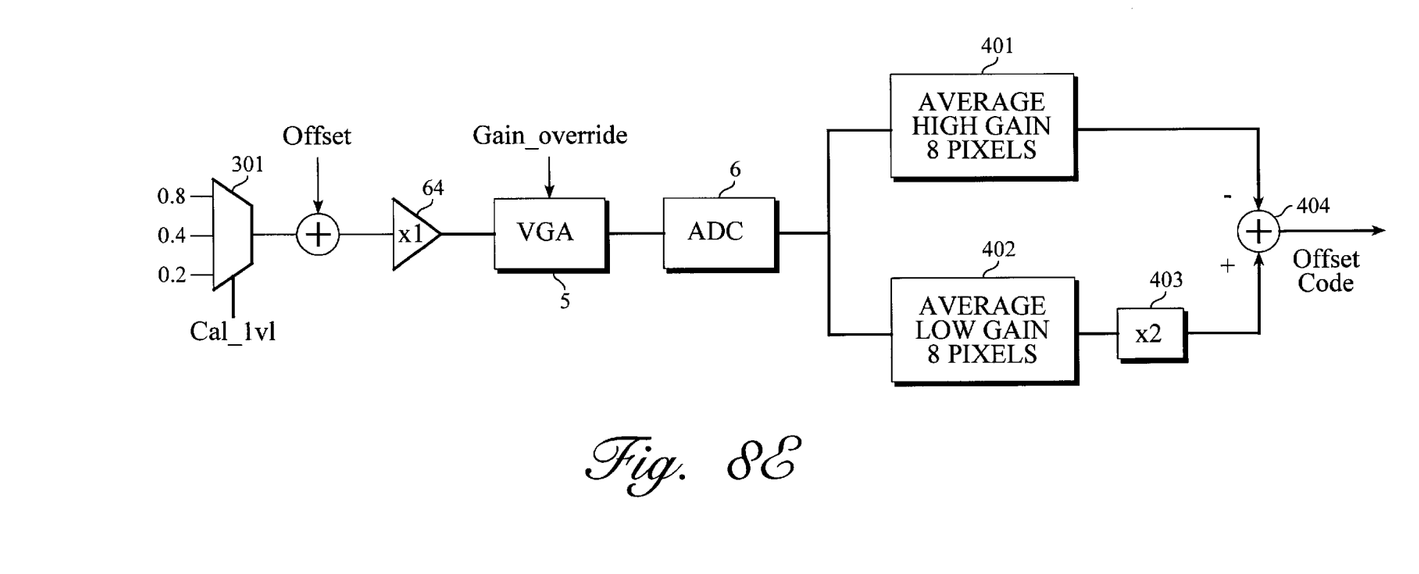
FIG. 8E is a diagram of selected portions of a controllable dynamic range extension signal processing (DRX) circuit according to the present invention, for processing signals received from a selected imaging device.

Referring now to FIG. 8E, there is shown a diagram of selected portions of a controllable dynamic range extension signal processing (DRX) circuit for processing signals received from a selected imaging device. The DRX circuit portions shown include a multiplexer 301 and a variable gain amplifier (VGA) 5 subject to automatic gain control according to the present invention. The VGA 5 has input and output connections which respectively receive an input analog signal and produce an output amplified analog signal in accordance with the gain setting which is current for the VGA 5. The DRX circuit further includes an analog-to-digital converter (ADC) 6 which digitizes the analog signal received from the VGA 5. The DRX circuit further includes respective circuit blocks 401 and 402 respectively for averaging the values of a set of eight high gain pixels, and for averaging the values of a set of eight low gain pixels. The DRX circuit further includes a multiplication block 403, and a summation block 404 to produce a desired offset code according to the present invention. In operation, the multiplexer 301 is controlled by a calibration level signal cal_lvl which is used to apply a two-bit calibration level selection code to select one of input voltage levels, Vref+0.8, Vref+0.4, or Vref+0.2, for application at the output of multiplexer 301. An offset value is provided from black capacitor 63 based upon the particular offset code applied. The combined multiplexer and offset values are provided to amplifier 64 which in turn feeds the VGA 5 subject to a predetermined gain-override value, which according to the present invention is set for 8 sessions of average testing to a high gain value for high gain averaging 401, and for 8 sessions to a halved low gain value for low gain averaging 402 subject to level multiplication by doubler circuit 403. The unitary and halved average values are provided to a summation node 404 which produces the offset code according to the present invention.

Figure 9A:
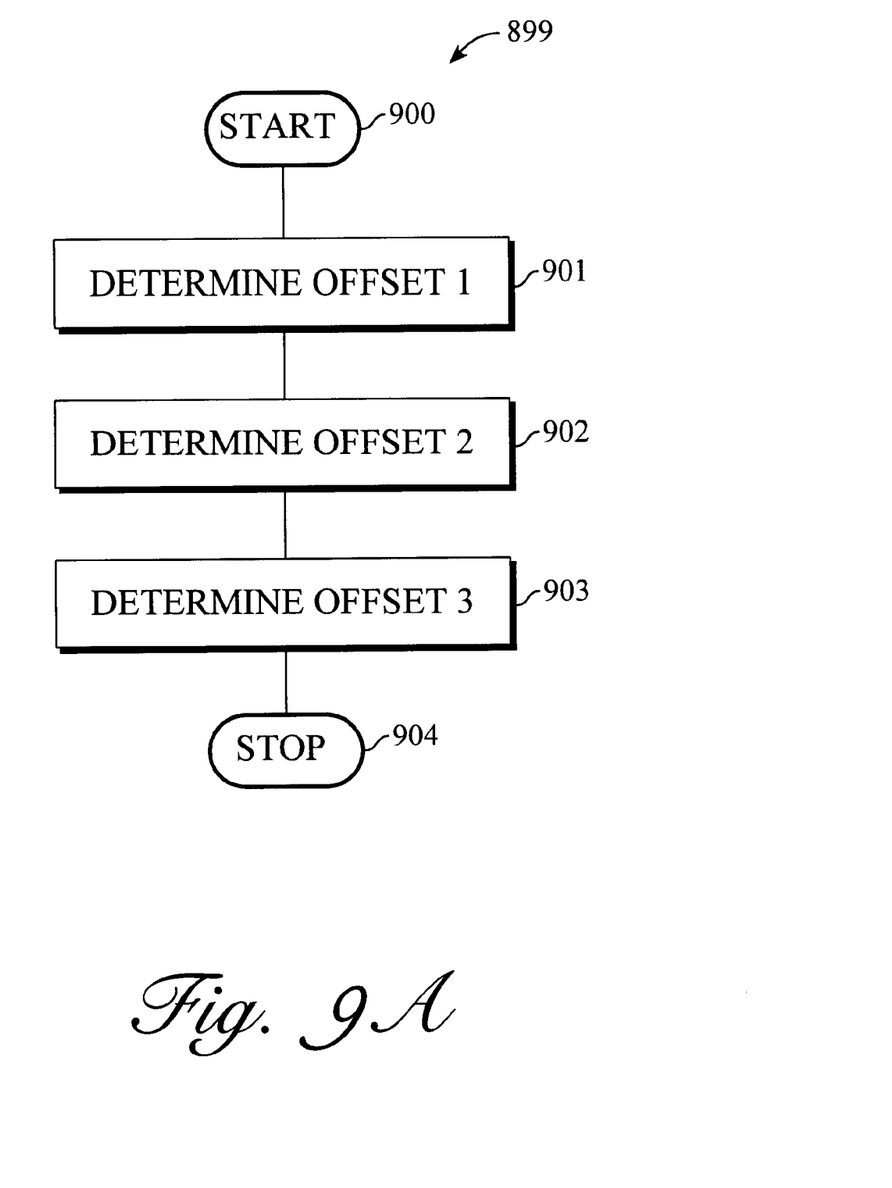
FIG. 9A is a flow chart of a offset value determination method according to the present invention showing the successive determination of respective offset values, OFFSET1, OFFSET2, and OFFSET3.

Referring now to FIG. 9A, there is shown a flow chart of an offset value determination method 899 according to the present invention showing the successive determination of respective offset values, OFFSET1, OFFSET2, and OFFSET3. In particular, the offset value determination method 899 starts 900 and then determines 901 the value of OFFSET1, as will be discussed below. Next, the value of OFFSET2 is determined 902. Finally, the value of OFFSET3 is determined 903, followed by completion and stopping 904 of the offset determination method 899.

Figure 9B:
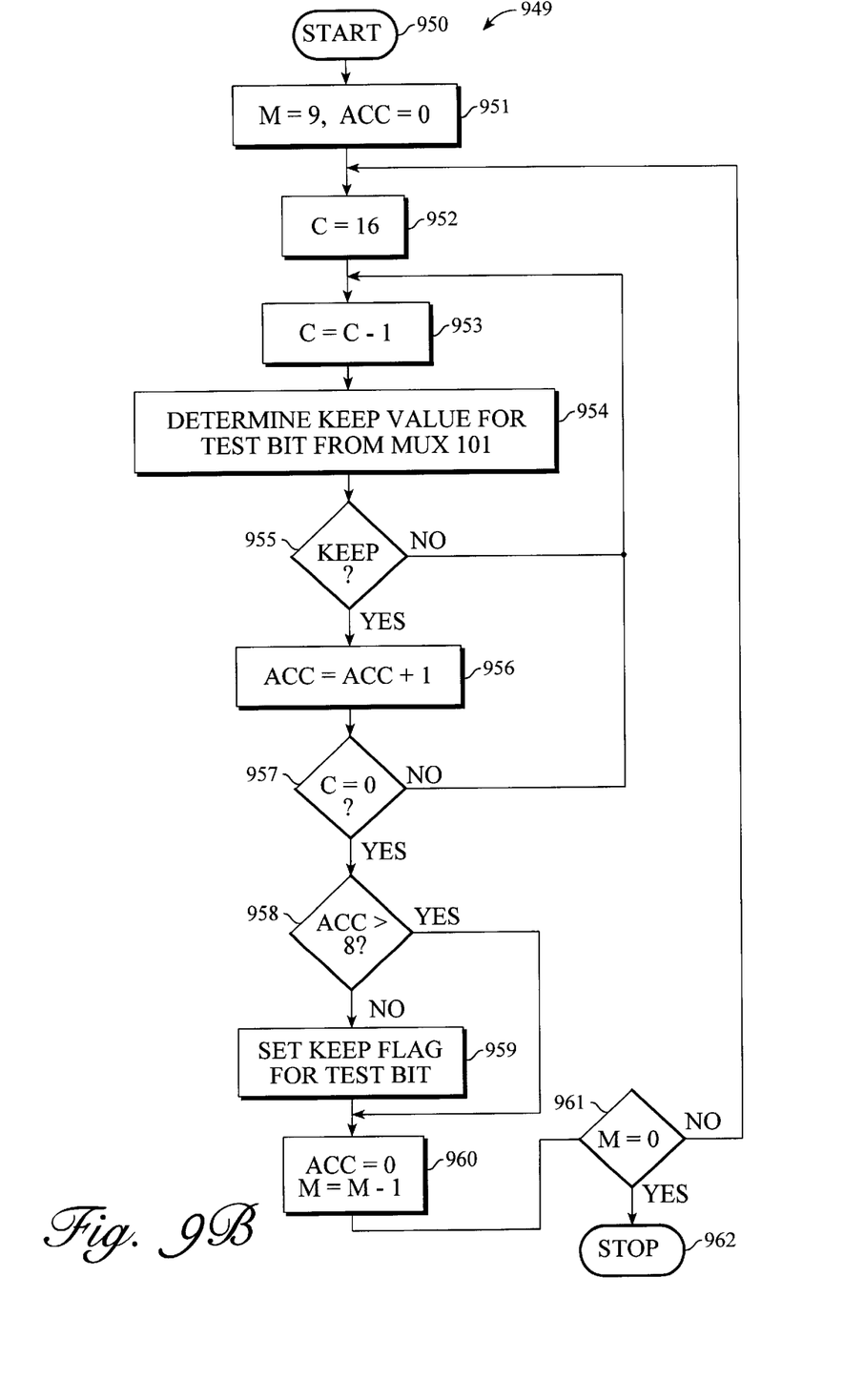
FIG. 9B is a flow chart of a method according to the present invention for the determination of a single one of the offset values, OFFSET1, OFFSET2, and OFFSET3.

Referring now to FIG. 9B, there is shown a flow chart of a method 949 accomplished after power-up of the system shown in FIG. 1, according to the present invention for the determination of a single one of the offset values, OFFSET1, OFFSET2, and OFFSET3, expressly set forth in FIG. 1. In particular, the determination of a selected one of the offset values starts 950 with determination of whether to keep a most significant one of the bits of the particular offset value, by setting 951 predetermined initial values of certain variables including M=9 and ACC=0. ACC is an accumulator value which accumulates an index permitting assessment of a bit keep determination by averaging a predetermined plurality of keep tests as to a particular selected test bit. According to one embodiment of the present invention, an averaged keep test as to a particular significant test bit includes the average of 16 tests. Accordingly, an averaging test counter variable "C" is set 952 equal to 16. Next, the value of C is reduced 953 by a single number. Then, a determination is made as to a single one of the 16 tests, to determine whether the tested bit is to be kept in view of the output value of multiplexer 101. The multiplexer 101 produces a keep or not keep value in response to an OFFSET CODE containing the test bit, setting the variable capacitance of the black capacitor 63. This results in op-amp 64 providing an input to 2-bit ADC 11. Next, a determination is made 955 as to the logical value of the keep indication provided by multiplexer 101. If the keep indication is affirmative, the accumulator variable ACC is upward incremented 956 by a single unit amount. If 16 averaging evolutions have not yet been completed 957, operation continues with decrementation 953 of the counter C. Once the averaging evolutions have been completed, a check is undertaken 958 to determine whether the accumulated value of the accumulator variable ACC is greater than eight (8). If ACC is greater than 8, the keep flag is set 959 for the particular test bit, based upon averaging. Next, the accumulator variable is reset to zero, and a new test bit of next lesser significance is selected 960, for initiation 952 of the 16 averages cycle just discussed. If all significant bits have already been tested 961 to produce an averaged multi-bit code offset value, the operation according to the method of the invention stops 962.

What is claimed is:

1. A method of extending the dynamic range of an electrical system including a variable gain amplifier connected to an analog-to-digital converter producing an output signal of predetermined bit-width, said method comprising:

receiving an analog signal of particular temporal magnitude;

amplifying the received analog signal by a first gain value;

changing said first gain value to a second gain value as a function of the temporal magnitude of the received analog signal;

converting the analog signal into a counterpart digital signal of predetermined bit-width;

modifying the counterpart digital signal with a selected one of predetermined offset values effective to ensure continuous linearity; and adjusting the bit-width of the counterpart digital signal to compensate for a change in amplification provided by said variable gain amplifier; and wherein an offset value corresponds to each trip-point in the slope of an ADC characteristic.

2. A method of extending the dynamic range of an electrical system including a variable gain amplifier connected to an analog-to-digital converter producing an output signal of predetermined bit-width, said method comprising:

receiving an analog signal of particular temporal magnitude;

amplifying the received analog signal by a first gain value;

changing said first gain value to a second gain value as a function of the temporal magnitude of the received analog signal;

converting the analog signal into a counterpart digital signal of predetermined bit-width;

modifying the counterpart digital signal with a selected one of predetermined offset values effective to ensure continuous linearity;

adjusting the bit-width of the counterpart digital signal to compensate for a change in amplification provided by said variable gain amplifier; and continuously extending the dynamic range of the electrical system, without abrupt variations.

3. A method of extending the dynamic range of an electrical system including a variable gain amplifier connected to an analog-to-digital converter producing an output signal of predetermined bit-width, said method comprising:

receiving an analog signal of particular temporal magnitude;

amplifying the received analog signal by a first gain value;

changing said first main value to a second gain value as a function of the temporal magnitude of the received analog signal;

converting the analog signal into a counterpart digital signal of predetermined bit-width;

modifying the counterpart digital signal with a selected one of predetermined offset values effective to ensure continuous linearity;

adjusting the bit-width of the counterpart digital signal to compensate for a change in amplification provided by said variable gain amplifier; and producing an output digital signal indicative of whether the analog signal detected exceeds a particular one of a plurality of predetermined thresholds and applying an offset corresponding to the particular threshold.

4. A processing system for an imager device comprising:

a camera system for producing an imager signal;

a correlated double sample circuit for receiving data from an imager;

a variable gain amplifier connected to said correlated double sample circuit, for receiving the sampled output of the correlated double sample circuit;

an analog-to-digital converter (ADC) coupled to said variable gain amplifier;

a shifter for holding a bit sequence of predetermined length, said shifter connected to the output of said ADC; and a control circuit coupled to the output of said correlated double sample circuit and adapted to control the amplification setting of said variable gain amplifier, and to control the shift status of bits in said shifter, as well as to apply an offset value to correct a discontinuity in the gain characteristic; and wherein said control circuit includes another analog-to-digital converter and logic circuitry for determining the values of offsets to be used in eliminating discontinuities in the gain characteristic; and wherein said another analog-to-digital converter includes a plurality of comparators connected to the output of said correlated double sampling circuit, which are used to determine offset values used to eliminate discontinuities in the gain characteristic.

5. The processing system according to claim 4 wherein each of said comparators includes a positive input terminal connected to the output of said correlated double sampling circuit.

6. A method of correcting the extension of the dynamic range of an imaging system having a correlated double sampling system, a variable gain amplifier circuit connected to said correlated double sampling system, an analog-to-digital converter connected to said variable gain amplifier circuit, and a shifter containing a predetermined number of bits greater than the digital output width of said analog-to-digital converter, said shifter connected to said analog-to-digital converter for receiving the output bit set of said analog-to-digital converter into predetermined locations in said shifter, including:

determining the magnitude of input signals from an imaging system, which are sampled by a correlated double sampling system;

adjusting the gain in a variable gain amplifier in a selected direction;

determining adjustment offset values corresponding to trip points at which gain adjustments are made; and repositioning the bit set stored in said shifter in an opposite direction from the gain direction expressed upon said variable gain amplifier, to produce a digital output of greater dynamic range from said shifter than from said analog-to-digital converter.

7. The method according to claim 6 including detecting the magnitude of the output of said correlated double sampling system to determine the adjustment of bit shifts in said shifter and the offset value to be added to the output of the ADC.

8. The method according to claim 6 wherein the VGA gain has a plurality of trip points with corresponding offset correction values.

* * * * *